United States Patent
Petrarca et al.

(10) Patent No.: US 8,350,359 B2
(45) Date of Patent: Jan. 8, 2013

(54) SEMICONDUCTOR DEVICE USING AN ALUMINUM INTERCONNECT TO FORM THROUGH-SILICON VIAS

(75) Inventors: Kevin S. Petrarca, Newburgh, NY (US); Matthew Angyal, Stormville, NY (US); Lawrence A. Clevenger, LaGrangeville, NY (US); Carl Radens, LaGrangeville, NY (US); Brian C. Sapp, Gainesville, FL (US)

(73) Assignee: International Business Machines Corporation, Armonk, NY (US)

( * ) Notice: Subject to any disclaimer, the term of this patent is extended or adjusted under 35 U.S.C. 154(b) by 654 days.

(21) Appl. No.: 12/539,105

(22) Filed: Aug. 11, 2009

(65) Prior Publication Data

US 2011/0037143 A1     Feb. 17, 2011

(51) Int. Cl.
*H01L 21/02*    (2006.01)
*H01L 29/40*    (2006.01)

(52) U.S. Cl. .............. 257/532; 257/774; 257/E23.011; 438/381; 438/667

(58) Field of Classification Search .............. 257/774, 257/E23.011, E21.597; 438/667
See application file for complete search history.

(56) References Cited

U.S. PATENT DOCUMENTS

| | | | |
|---|---|---|---|
| 6,350,696 B1 | 2/2002 | Shields et al. | |
| 6,811,853 B1 * | 11/2004 | Sherrer et al. | 428/138 |
| 7,470,998 B2 * | 12/2008 | Okumura et al. | 257/784 |
| 8,053,902 B2 * | 11/2011 | Chen et al. | 257/776 |
| 2004/0203224 A1 * | 10/2004 | Halahan et al. | 438/637 |
| 2007/0048994 A1 * | 3/2007 | Tuttle | 438/597 |
| 2007/0178694 A1 * | 8/2007 | Hiatt | 438/667 |

* cited by examiner

*Primary Examiner* — Calvin Lee
*Assistant Examiner* — Scott Stowe
(74) *Attorney, Agent, or Firm* — H. Daniel Schnurmann

(57) ABSTRACT

An aluminum lateral interconnect of a Back End of the Line (BEOL) is used to define the x and y dimensions of a through-silicon via in a semiconductor chip formed in a silicon substrate. The TSV includes one or more aluminum annulus formed on a surface of the substrate, and a deep trench in the substrate having a diameter that is determined by the diameter of the aluminum annulus. The annulus can also be provided with a conductive strap upon which a capacitor can be formed. The strap can also be used to provide a connection of the TSV to other BEOL interconnects.

16 Claims, 5 Drawing Sheets

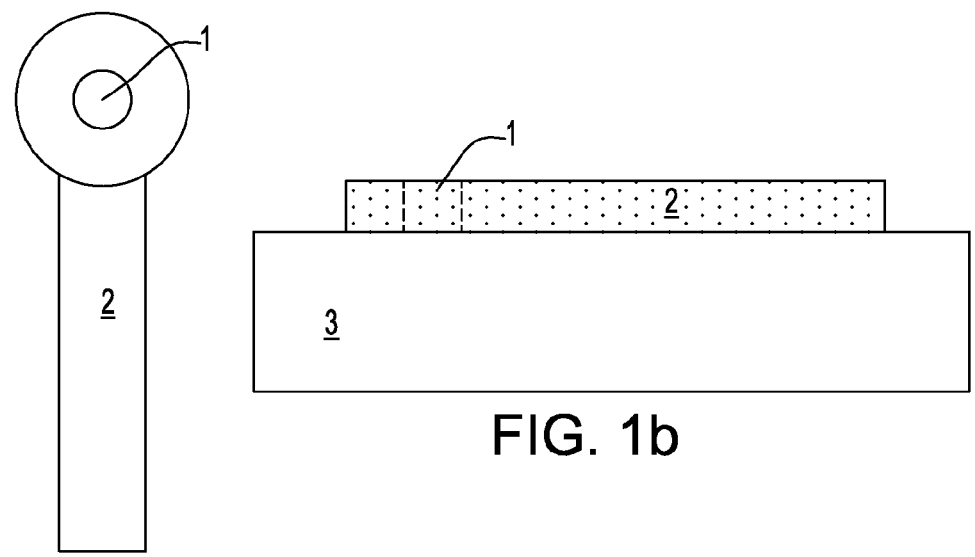
FIG. 1a
FIG. 1b
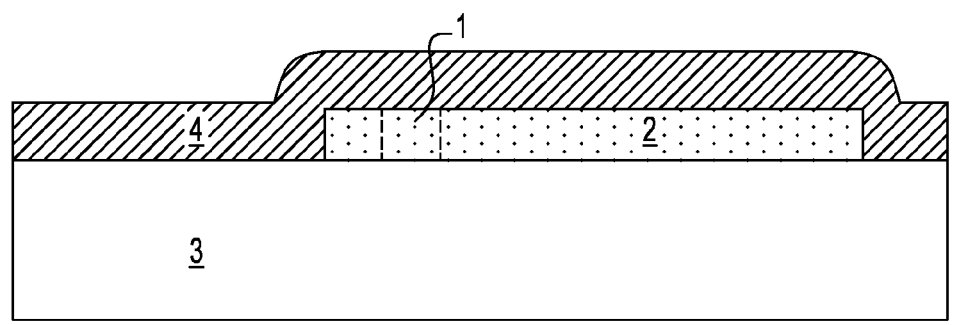
FIG. 2
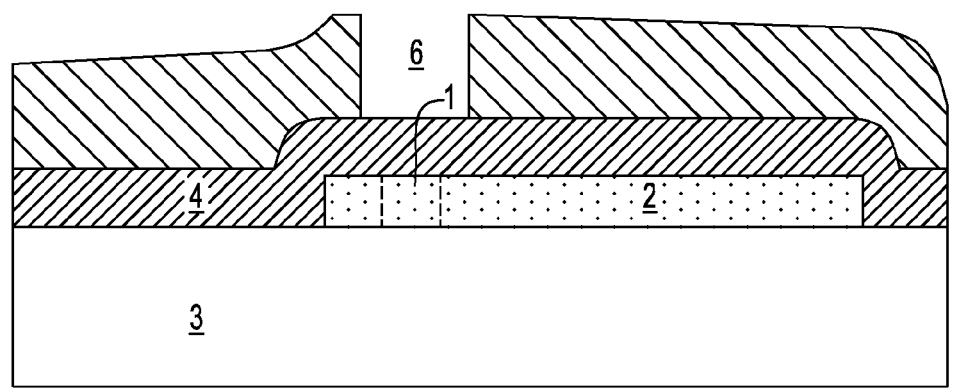
FIG. 3

SEMICONDUCTOR DEVICE USING AN ALUMINUM INTERCONNECT TO FORM THROUGH-SILICON VIAS

FIELD OF THE INVENTION

The present invention relates to a method and a structure for electrically interconnecting integrated circuit semiconductor devices, and more particularly, to the formation of interconnects having through-silicon vias formed by way of an aluminum deposition, facilitating the formation of passive devices in a Back End of Line of a semiconductor chip.

BACKGROUND OF THE INVENTION

Packaging technologies for a semiconductor integrated device have been continuously developed to satisfy the demands for mounting efficiency and miniaturization. Various semiconductor interconnect technologies have been developed as the miniaturization and high performance resulting from recent development trends in the semiconductor chip devices technology.

Interconnects and packaging-related issues are among factors that determine not only the number of circuits that can be integrated in a semiconductor die or "chip," but also the chip performance. These issues have gained importance as advances in chip design have led to reduced sizes of transistors and enhanced chip performance. Practitioners in the art have come to realize that merely having a fast chip does not necessarily result in a fast system; a fast chip must also be supported by equally fast and reliable electrical connections. Essentially, on-chip connections in conjunction with those of the chip's associated packaging supply the chip with signals and power, provide signals from the chip and redistribute the tightly spaced or pitched terminals or bond pads of the chip to the terminals of a carrier substrate such as a printed circuit board.

Though much effort has been expended by practitioners working on making through-silicon vias (TSV) for various technology offerings, there are few that are presently in manufacturing. These are mainly used for interposers, i.e., an interface between a chip and a package that allows an amount of expansion difference between the package and the die or chip, and which accommodates the thermal coefficient of expansion difference between the silicon chip and the package.

The main thrust of current work resides in developing TSVs that are fabricated in a way where they can be incorporated in the functional chips, allowing the chips to be stacked or joined in order to increase the functionality of the chip set. This includes reduced power and in kind the reduction of heat, while offing an increase in performance of the entire set.

When stacking chips, the TSV connections are not necessarily vertically aligned. To simply state it, if there are three TSVs in a chip stack of a multiple of chips, the first TSV may need to be electrically connected to the package, the second may require connecting a first chip, a second chip and a third which may need to be connected to the first and third chips. A problem arises if a TSV is required to connect the chip interconnects within the die or chip. Other TSVs may also be independently added to the same chip to be etched through the chip. This can be achieved with multiple steps, however with the addition of these steps there is associated yield loss and expense. Furthermore, if there is the requirement of a passive element that needs to be fabricated after the TSV, it can become problematic because of the topography, if the conductivity requirements specify a copper TSV. The large copper feature lends itself to topography creation due to chemical mechanical polish (CMP). Therefore, two issues include stopping the large via etch that needs to be electrically connected to the BEOL interconnections while also having large TSV's that will be etched through the entire chip build, and processing a passive element post TSV processing, such as a MIM capacitor.

In summary, TSV technology is important in creating 3D packages and 3D integrated circuits in a smaller footprint to maintain a superior electrical performance. Chip-to-chip connections that have traditionally been accomplished with wire bonding often to multiple stacked die are limited in terms of the number of connections and electrical performance. Other existing structures and processes are characterized by vias etched through the silicon (and often many layers of metal and dielectric) using a deep-RIE (BOSCH) process, with an insulating layer deposited followed by a metal liner and, then, continuing with copper damascene processing.

Therefore, there is a need for a structure and a method for providing substrate interconnect using an integrated conductive hardmask stack for patterning TSVs to provide electrical connections between an integrated circuit chip and a package.

SUMMARY OF THE INVENTION

In one aspect of the invention, there is provided a structure and a method of forming TSVs to be utilized in the interconnect phase of a semiconductor chip.

In another aspect, an aluminum lateral interconnect in the BEOL uses an aluminum interconnect to determine the X and Y dimensions of a TSV, the TSV being a large feature when compared to the BEOL interconnects. The present invention provides a method and a structure that avoids problems associated with topography. The inventive aluminum feature limits the size, i.e., the X and Y dimensions of the TSV, and can be also be used as a BEOL conductor.

In still another aspect, the invention uses a layer of aluminum in the BEOL that controls the overlay and the critical dimensions. Since the TSV etch is devoid of chlorine in the plasma chemistry, etching will not affect the aluminum. By shaping the aluminum in an annular configuration, the entire annulus can be utilized to determine the placement (overlay) and the critical dimensions (CD). The width of the annulus can be made larger or smaller. If the width is made larger, it will facilitate the lithographic overlay, enabling a manufacturer to use less advanced equipment and consumables and making the process less expensive.

In yet another aspect of the invention, an aluminum/dielectric stack hard mask forms the TSV, leaving a portion of the hard mask for interconnecting the TSV to the BEOL. This hard mask allows to consume all of the photoresist, making it possible to accelerate the TSV etch. The aluminum is preferably deposited after the last metal level is completed and not capped. Accordingly, the aluminum remains in contact with the BEOL, and after the process comes to an end, it remains in contact with the TSV. The patterning etch selectivity the BEOL interlevel dielectric (ILD) and silicon substrate can be adjusted to select appropriate patterning material (photoactive polymer), dielectric cap (oxide/nitride/dielectrics), and optimum conductive layer thickness and material.

In a further aspect, the aluminum annulus is attached to an elongated extension acting as a conductive strap, providing an easy path to interact with BEOL interconnections without having to introduce in the design additional features connected to the TSV. In essence, a line connecting to the TSV provides the shape necessary to determine the size and placement of the TSV.

The inventive structure further provides substrate interconnects using an integrated conductive hardmask stack for patterning the TSV(s) and electrical connections to other BEOL interconnects. The aluminum annulus and the strap can be included in the design to facilitate the connections to the BEOL wiring, thereby increasing the flexibility of the design.

The invention provides a chip having one or more through-silicon vias including; an aluminum structure having at least one annulus formed on a surface of a silicon substrate; and at least one through-silicon via having a diameter that is determined by the diameter of the annulus having a depth that ends at least at the top surface of the at least one aluminum annulus. The invention includes an aluminum level placed between copper levels.

BRIEF DESCRIPTION OF THE DRAWINGS

The present invention will be understood and appreciated more fully from the following detailed description of the invention, taken in conjunction with the accompanying drawings of which:

FIGS. 1(a)-1(b) respectively show a top view of an aluminum annulus provided with a strap, and a cross-sectional view of the same feature atop a substrate, according to one embodiment of the invention.

FIG. 2 illustrates a conformal insulating layer deposited on the substrate depicted in FIG. 1.

FIG. 3 shows photoresist applied to the substrate and patterned forming a window opened over the annulus.

in FIG. 11b the opening is shifted to the left; and in FIG. 11c, the opening is enlarged.

DETAILED DESCRIPTION OF THE INVENTION

Figure 4:
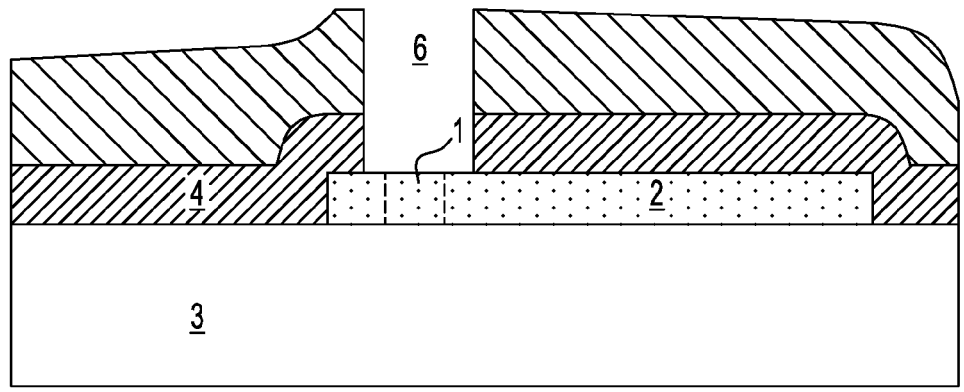
FIG. 4 shows a cross-section of the structure shown in FIG. 3 after reactive ion etching, creating an opening in the insulating layer that corresponds to the opening in the resist.

For simplicity and clarity, elements shown in the drawings have not necessarily been drawn to scale. For example, the dimensions of some of the elements of particular interest may be exaggerated relative to other elements.

Referring to FIG. 1(a), a top-down illustration of an aluminum annulus 1 connected to an aluminum strap 2 is shown. In the etch process for the through-silicon via, the chemistry used has little or no effect on the aluminum since aluminum etching requires a chlorine based chemistry not present in a TSV etch. Preferably, the annulus 1 has a 20 µm opening in the center, and an aluminum width of 4 µm. The aforementioned dimensions can be achieved by utilizing a lithography tool having an overlay specification greater or equal to 4 µm, permitting to use less advanced photoresist, since the sidewall of the resist becomes irrelevant in view of the RIE being shaped by the aluminum annulus. Additionally, once the TSV is completed and filled with conductor material, the aluminum annulus that masks the TSV can be fully integrated as part of a BEOL interconnect of the chip.

FIG. 1(b) shows a cross-section view of the aluminum structure atop the substrate 3. The aluminum is deposited and patterned using conventional methods, the aluminum thickness ranging from 0.6 µm to 4 µm. For illustrative purposes, 1.2 µm will be used hereinafter. Photoresist is patterned, and the aluminum is etched using a chlorine based chemistry plasma reactive ion etching.

Referring now to FIG. 2, a conformal insulating layer is deposited on the substrate 3. The preferred insulating material includes silicon nitride, silicon dioxide, fluorinated oxide or any combination thereof. Initially a layer of silicon nitride, in the order of 100 angstroms (Å) to 1000 Å is preferably deposited. For illustrative purposes, 1000 Å will be used. A silicon oxide layer is then deposited on the substrate followed by another silicon nitride layer. The silicon oxide thickness ranges from 0.5 µm to 2 µm, and the silicon nitride ranging from 100 Å to 1 µm. Hereinafter, 1 µm and 0.5 µm, respectively, will be used.

Referring to FIG. 3, photoresist 110 is applied on top of the insulator layer 4, and patterned to form window 6. This window is aligned with annulus 1 to be subsequently opened in the aluminum structure 2.

FIG. 4 shows a cross-section of the features after the reactive ion etching to create an opening in the insulating layer 4 that corresponds to the opening in the resist 6. The plasma etch is typically a $CF_4/O_2/Ar$ flow based etch for the silicon nitride and $CO/CF_4/Ar$ for silicon oxide. If a TiN layer is used to passivate the aluminum, a $CF_4/Ar$ chemistry can then be used to remove it from the open surface. The final silicon nitride etch ideally has an over etch time after completing the etch. The over etch components can run as long as 100% of the total etch time, but for practical purposes, a 60% over etch is sufficient to ensure that the annulus in the aluminum feature 2 is cleared of insulating material from layer 4.

Figure 5:
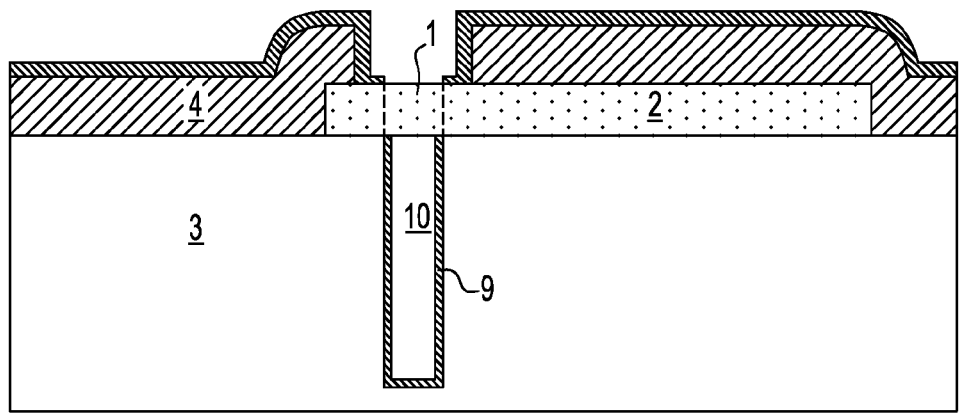
FIG. 5 illustrates the step of forming a deep silicon etch by cycling back and forth the feature deep into the silicon including a uniform sidewall, with the annulus of the aluminum feature defining the width of the deep silicon etch.

In FIG. 5, a deep silicon etch is preformed using, e.g., a process advanced by AMAT or LAM Research. A typical process consists of etching for a short time and then switching the process to deposit polymer that coats the sidewalls and then switching back to the etching process. By cycling back and forth, the feature can form a deep trench with uniform sidewalls 9 having an angle greater than 89°. In the present invention, the annulus 1 in the aluminum feature 2 defines the width (i.e., diameter) of the top of the deep trench 10. An ash process is preferably used as the last step of the etching to remove any residual photoresist, i.e., oxygen plasma that volatizes carbon containing constituents. Insulator layer 9 (e.g. oxide) is conformally deposited to form a sidewall. Typically, a greater thickness is deposited on the surface of the substrate than on the sidewalls of the etched feature. It is normal to have 60-70% of the surface thickness deposited on the sidewalls.

Figure 6:
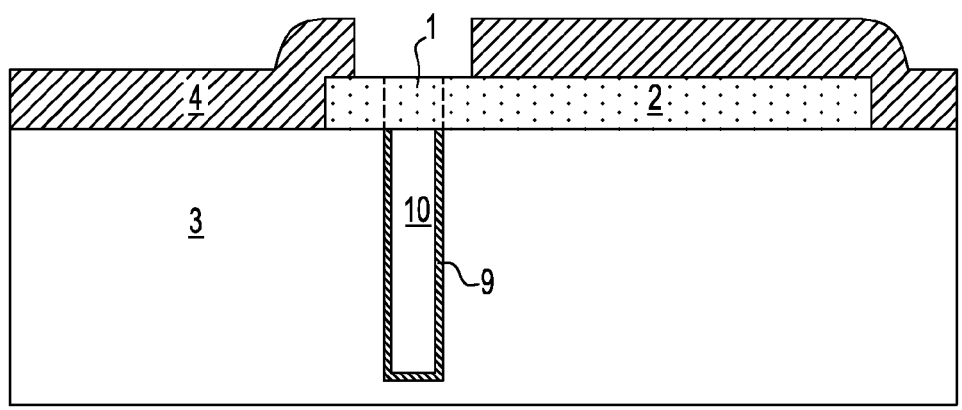
FIG. 6 illustrates the step of a low power etch used to remove the insulator from the top of the annulus.

Referring to FIG. 6, a low power etch removes the insulating material on top of the annulus, while leaving the insulator in the deep trench. Those familiar with etching sidewall spacer used for semiconductor devices can use for illustrative purposes the process described in U.S. Pat. No. 6,350,696.

Figure 7:
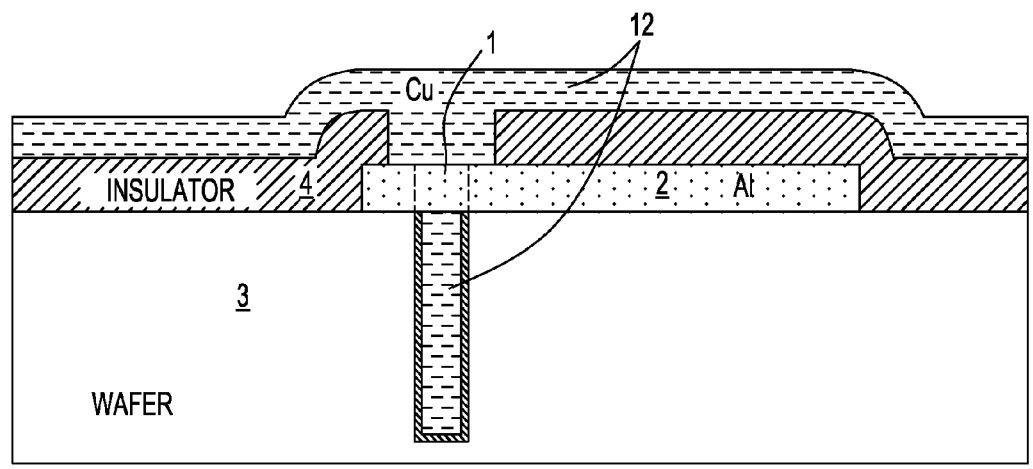
FIG. 7 illustrates the step of metal filling the TSV.

Referring now to FIG. 7, the substrate is subject to a metal fill 12, for illustrative purposes with copper, although other metals can also be used. A liner and a seed are then deposited, e.g., a Ta based liner with a copper seed layer for subsequent electroplating the substrate.

Figure 8:
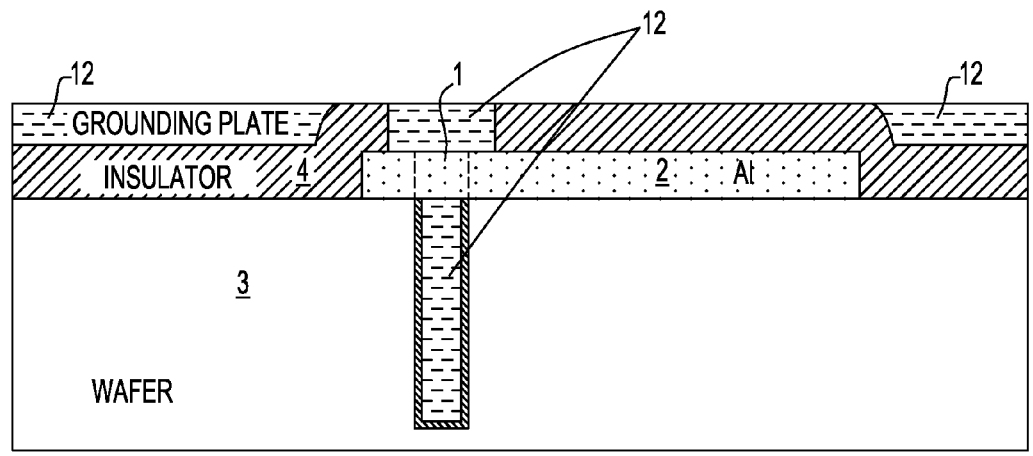
FIG. 8 shows the substrate exposed to chemical mechanical polish (CMP), planarizing the substrate by removing metal from undesired locations.

In FIG. 8, the substrate is exposed to chemical mechanical polish (CMP). This process planarizes the substrate by removing metal from undesired locations. The topography used to create aluminum feature 2 is transferred through the insulating layer 4, and a plane of copper is formed between the aluminum features horizontally, although separated vertically by insulating layer 4. However, if the user does not require a grounding plane, the topography may need to be eradicated. Preferably, insulator $Si_3N_4$ is removed, stopping at the $SiO_2$ insulating layer. The selectivity is reversed compared to normal silica slurry. In one embodiment, the slurry can be prepared from commercially available fumed silica, stabilized at alkaline pH (pH ranging from 9to 12). The pH is then advantageously adjusted to 2.4(range 2.2-2.6), with a 1:10 dilution in water of 86% phosphoric acid.

Still referring to the CMP process, in one embodiment, a conventional polish tool, such as Westech 372 can be advantageously used. A conventional urethane top pad (IC1000), non-woven sub-pad (SUBA IV) can be utilized, while maintaining a slurry flow at 150 ml/min (range 75-250 ml/min) with a down force of 3 psi. (range 1-8 psi) at a speed of 25 platen, 50 carrier (adjusted to achieve the best uniformity). The preferred wafer backside pressure should be adjusted to 2 psi to achieve a better uniformity. The pad conditioning consists of diamond grit, 70 µm, 0.5 psi, for 45 sec after each polish.

Figure 9:
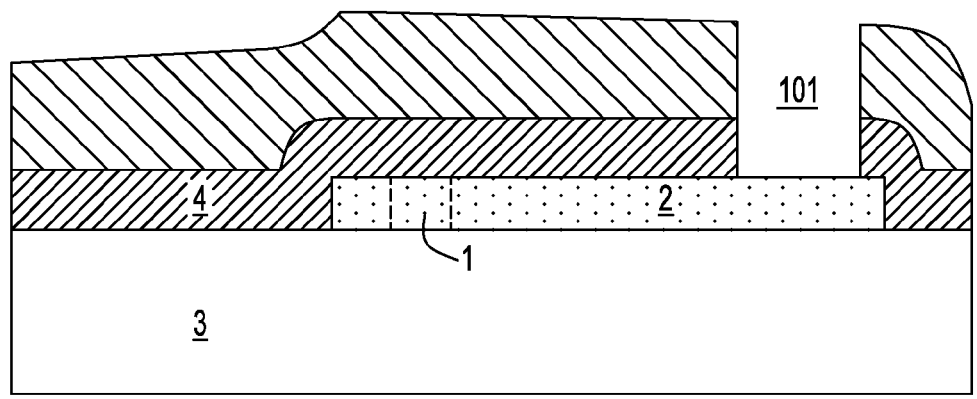
FIG. 9 illustrates a feature that is created at the end of the aluminum structure away from the annulus.
Figure 10:
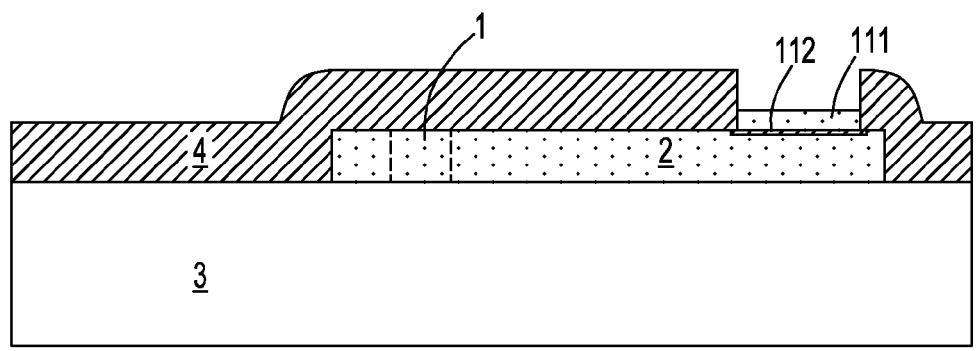
FIG. 10 illustrates a thin silicon nitride layer followed by an aluminum layer deposited and patterned using lithography and RIE, as shown in FIGS. 1(a) and 1(b).

FIGS. 9 and 10 illustrate an embodiment preferably performed prior to forming the structure shown in FIG. 1. In FIG. 9, a feature is created in the longitudinal portion of the aluminum structure 2, i.e., away from the annulus 1. Photoresist 110 is deposited on top of insulator layer 4 and patterned, to be followed by etching window 101 down to the aluminum structure 2. This feature is preferably formed using the same lithographic and RIE processes described with reference to FIGS. 3 and 4. The window 101 thus constructed is used to provide electrical connections (not shown).

In FIG. 10, a thin silicon nitride layer 112 having a thickness of approximately 100 Å is deposited, and is followed by an aluminum layer 111 deposited and patterned using lithography and RIE, as described with reference to FIGS. 1(a) and 1(b). At this point, the substrate is subjected to the processes previously described with reference to FIGS. 1 through 9 that allow forming a TSV, a ground plane and a capacitor that are metal filled and concurrently polished. It should be noted that a capacitor can be created on the annulus itself. However, given topography challenges that may ensue, it is not recommended until a CMP, i.e., the planarization process, is developed that eliminates an undesired topography.

Another embodiment of the invention consists of forming the aluminum feature on the substrate previously discussed with reference to FIG. 1 and followed by the insulator layer, as shown in FIG. 2. However, the present embodiment preferably forms an insulator deposition having a thickness greater than that of the aluminum. The insulator deposition includes forming a silicon nitride $Si_3Ni_4$ cap followed by silicon oxide $SiO_2$ and again by $Si_3Ni_4$. For illustrative purposes, a 1.2 µm thick aluminum feature 2, a 1000 Å $Si_3Ni_4$ cap and a 1 µm silicon oxide deposition are followed by a 5000 Å deposition of $Si_3Ni_4$. An insulator polish is then used on the silicon nitride and, selectively, on the silicon oxide. The silicon oxide polish rate is substantially lower than the silicon nitride rate. This allows the user to eliminate the topography caused by having the aluminum elevated over the substrate. This is possible if the user does not wish to have a ground plane above the aluminum features, although not directly above them.

Any silicon oxide slurry commercially available can advantageously be used, preferably including a silicon oxide polish slurry that is selective to silicon nitride and is followed by a second silicon oxide polish. This allows the user to achieve a substantially planar insulator surface 4. The benefit of the polishing sequence and planarized surface is that a deep silicon via filled with metal and polished will dispense having a ground metal plane on the surface of the insulator, as it is evident from FIG. 9.

Figure 11A:
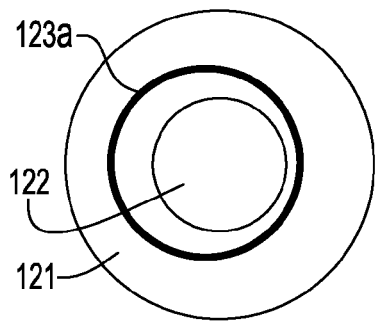
FIGS. 11a, 11b and 11c illustrate an embodiment of the present invention depicting an annulus having an opening formed on the substrate and a feature with openings in the photoresist, in which in FIG. 11a, the photo patterning is shifted to the right.
Figure 11B:
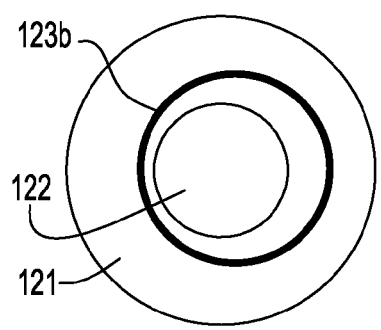
Figure 11C:
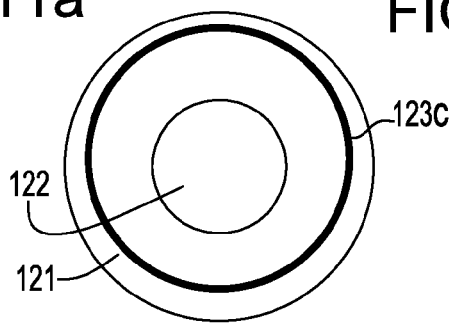

FIGS. 11a, 11b and 11c illustrate an embodiment wherein an annulus 121 is shown having an opening 122 formed on the substrate. The feature 123a, 123b and 123c are openings in the photoresist, in which, in FIG. 11a, the photo-patterning is shifted to the right; in FIG. 11b, the opening is shifted to the left. In FIG. 11c, the opening is enlarged. In all three of these circumstances, the TSV etch will generate the same feature.

In an embodiment of the present invention, an issue of supplying sufficient current to the chip can arise when the design requires C4 solder bumps that are smaller than normal. If the C4 solder bumps are in the range of 25 µm, the current they carry is limited. Therefore, more than one small C4 will be required to supply the necessary current to the TSV(s).

Figure 12:
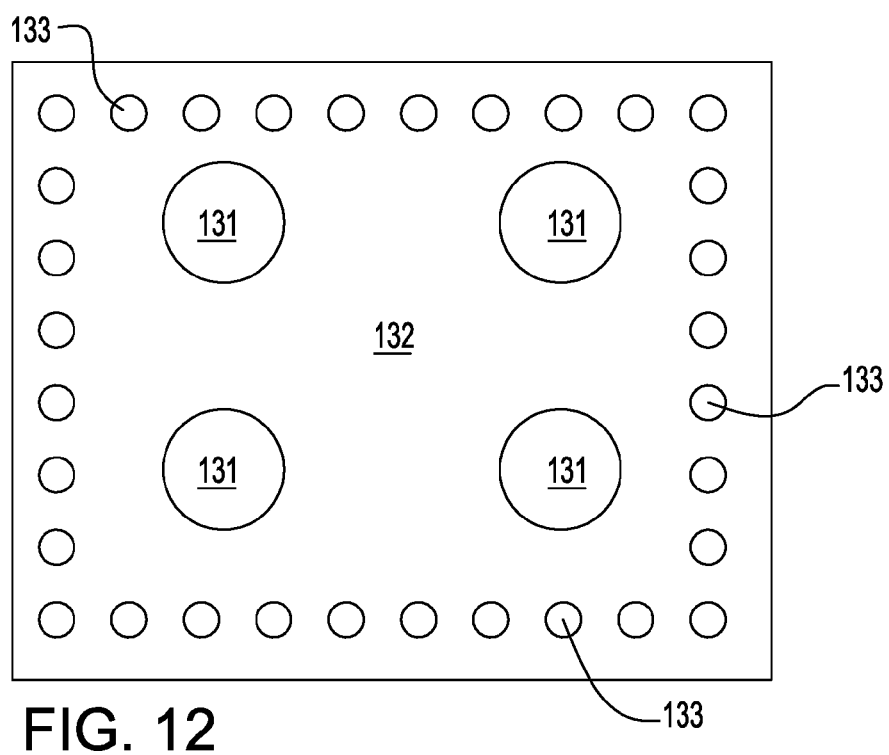
FIG. 12 is an aluminum block or plate on a substrate, having openings used to form one or more TSVs.

In FIG. 12, a large block or plate of aluminum 132 is formed on the substrate. Aluminum is formed with openings therein that create one or more TSVs 131, after which a multiple of small C4s can be utilized to supply the necessary current needed to enable the chip for adequate operation.

While the present invention has been particularly described in conjunction of a simple illustrative embodiment, it is to be understood that one of ordinary skill in the art can extend and apply the invention in many obvious ways. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of forming a chip having one or more through-silicon vias (TSV) in a substrate comprising: forming at least one aluminum annulus on said substrate; depositing an insulator layer superimposed on top of said at least one aluminum annulus and said substrate; etching at least one window through said substrate forming a deep trench having an upper diameter determined by an opening extending through a photoresist and through said insulator layer and a lower diameter determined by the diameter of said at least one aluminum annulus; forming an insulator sidewall in said deep trench and filling said deep trench with conductive material up to at least a top surface of said at least one aluminum annulus; and forming a capacitor having a first plate on a part of a conductive strap connected to said at least one aluminum annulus; a dielectric of said capacitor from a portion of an insulator; and a top plate of said capacitor made of conductive material.

2. The method as recited in claim 1 wherein said forming said conductive strap provides a contact to BEOL interconnects of said semiconductor chip.

3. The method as recited in claim 1 wherein said at least one aluminum annulus is a mask used to form said at least one TSV.

4. The method as recited in claim 1, further comprises forming said at least one aluminum annulus with an opening formed on said substrate, wherein the openings of said photoresist are shifted with respect to the opening of said at least one aluminum annulus.

5. A chip having one or more through-silicon vias (TSV) comprising;
   at least one aluminum annulus formed on a surface of a substrate;
   an insulator layer superimposed on top of said substrate and said at least one aluminum annulus;
   an opening in said insulator layer over said at least one aluminum annulus, said opening having a diameter that is larger than the diameter of said at least one aluminum annulus;
   at least one deep trench in said substrate having a diameter that is determined by the diameter of said at least one aluminum annulus, said at least one aluminum annulus being provided with a strap; and
   a capacitor formed at an end of said strap away from said at least one aluminum, annulus.

6. The chip as recited in claim 5, wherein said at least one deep trench is provided with a uniform sidewall.

7. The chip as recited in claim 5, wherein said at least one deep trench is filled with conductive material.

8. The chip as recited in claim 5, wherein said at least one aluminum annulus is independent of Back End of the Line (BEOL) interconnects.

9. The chip as recited in claim 8, wherein said at least one aluminum annulus that masks said one or more TSVs is an integral part of said BEOL interconnects of said chip.

10. The chip as recited in claim 5, wherein said at least one aluminum annulus determines overlay and critical dimensions of said one or more TSVs.

11. The chip as recited in claim 5, further comprising electrical connections to BEOL wiring interconnects.

12. The chip as recited in claim 5, wherein said at least one deep trench has a depth that ends at least at a top surface of said at least one aluminum annulus.

13. The chip as recited in claim 12, further comprising planarizing the top surface of a ground plane, the top surface of said at least one deep trench and the top surface of an insulator layer interposed therebetween.

14. The chip as recited in claim 5, wherein said at least one aluminum annulus is covered by insulating material, said insulating material being selected from a group consisting of silicon nitride, silicon dioxide, fluorinated oxide and any combination thereof.

15. The chip as recited in claim 5, wherein said capacitor has a first plate formed by said strap, a portion of an insulating layer, and a top plate of said capacitor.

16. The chip as recited in claim 15, wherein said through-silicon via, a grounding plate, and said top plate of said capacitor are concurrently filled with metal.

* * * * *